(12) United States Patent
Akram

(10) Patent No.: US 6,214,716 B1
(45) Date of Patent: Apr. 10, 2001

(54) SEMICONDUCTOR SUBSTRATE-BASED BGA INTERCONNECTION AND METHODS OF FARICATION SAME

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/164,113

(22) Filed: Sep. 30, 1998

(51) Int. Cl.[7] ................................................ H01L 21/44
(52) U.S. Cl. ........................ 438/612; 438/613; 438/614; 438/639; 438/640
(58) Field of Search .................................. 438/612, 613, 438/614, 639, 640, 650, 648, 678, 687, 685, 686, 700, 623

(56) References Cited

U.S. PATENT DOCUMENTS

| | | |
|---|---|---|
| 5,073,117 | 12/1991 | Malhi et al. . |
| 5,088,190 | 2/1992 | Malhi et al. . |
| 5,367,253 | 11/1994 | Wood et al. . |
| 5,448,165 | 9/1995 | Hodge et al. . |
| 5,451,165 | 9/1995 | Cearley-Cabbiness et al. . |
| 5,468,157 | 11/1995 | Roebuck et al. . |
| 5,468,158 | 11/1995 | Roebuck et al. . |
| 5,475,317 | 12/1995 | Smith . |
| 5,479,105 | 12/1995 | Kim et al. . |
| 5,483,174 | 1/1996 | Hembree et al. . |
| 5,519,332 | 5/1996 | Wood et al. . |
| 5,843,845 | * 12/1998 | Chung .................................. 438/713 |
| 5,851,911 | * 12/1998 | Farnworth ............................ 438/614 |

\* cited by examiner

Primary Examiner—Caridad Everhart
(74) Attorney, Agent, or Firm—Trask Britt

(57) ABSTRACT

The present invention relates to a method of forming interconnections for a temporary package, wherein the interconnections are capable of receiving solder balls on a die, partial wafer or wafer under test for testing and burn-in. The interconnections are formed in recesses sized and shaped to receive and contain approximately 10% to 50%, and preferably about 30%, of the total height of each solder ball within its associated interconnection. Such a design compensates for undersized or misshapen solder balls on the die under test and thereby prevents a possible false failure indication for the die under test. This design also distributes the forces on the solder ball caused by biasing the die under test to its temporary package to the periphery of the solder ball and thus reduces the likelihood of damage to the solder ball or the semiconductor substrate.

8 Claims, 11 Drawing Sheets

SEMICONDUCTOR SUBSTRATE-BASED BGA INTERCONNECTION AND METHODS OF FARICATION SAME

BACKGROUND OF THE INVENTION

1. Field of the Invention

The present invention relates to a method for forming an interconnection for receiving bumps or balls of a semiconductor device for testing or burn-in of the device. In particular, the present invention relates to a method for forming sloped wall, metal-lined interconnections to receive and contain portions of solder balls of a semiconductor device therein.

2. State of the Art

Integrated circuit devices are well-known in the prior art. Such devices, or so-called "semiconductor dice," may include a large number of active semiconductor components (such as diodes, transistors) in combination with (e.g., in one or more circuits) various passive components (such as capacitors, resistors), all residing on a "semiconductor chip" or die of silicon or, less typically, gallium arsenide or indium phosphide. The combination of components results in a semiconductor or integrated circuit die which performs one or more specific functions, such as a microprocessor die or a memory die, the latter as exemplified by ROM, PROM, EPROM, EEPROM, DRAM and SRAM dice.

Such semiconductor dice are normally designed to be supported or carried in an encapsulant or other package and normally have a plurality of externally-accessible connection elements in the form of solder balls, pins, or leads, to which the circuits on each semiconductor die are electrically connected within the package to access other electronic components employed in combination with each semiconductor die. Bond pads on the active surface of a die may be directly in contact with the connection elements, or connected thereto with intermediate elements, such as bond wires or TAB (Tape Automated Bonding, or flex circuit) connections, or rerouting traces extending to remote locations on the die active surface. An encapsulant is usually a filled polymer compound transfer molded about the semiconductor die to provide mechanical support and environmental protection for the semiconductor die, may incorporate a heat sink in contact with the die, and is normally square or rectangular in shape.

Bare semiconductor dice are usually tested at least for continuity, and often more extensively, during the semiconductor die fabrication process and before packaging. Such more extensive testing may be, and has been, accomplished by placing a bare semiconductor die in a temporary package having terminals aligned with the terminals (bond pads) of the semiconductor die to provide electrical access to the circuits on the semiconductor die and subjecting the semiconductor die via the assembled temporary package to burn-in and discrete testing. Such temporary packages may also be used to test entire semiconductor wafers prior to singulating the semiconductor wafers into individual semiconductor dice. Exemplary state-of-the-art fixtures and temporary packages for semiconductor die testing are disclosed in U.S. Pat. Nos. 5,367,253; 5,519,332; 5,448,165; 5,475,317; 5,468,157; 5,468,158; 5,483,174; 5,451,165; 5,479,105; 5,088,190; and 5,073,117. U.S. Pat. Nos. 5,367,253 and 5,519,332, assigned to the assignee of the present application, are each hereby incorporated herein for all purposes by this reference.

Discrete testing includes testing the semiconductor dice for speed and for errors which may occur after fabrication and after burn-in. Burn-in is a reliability test of a semiconductor die to identify physical and electrical defects which would cause the semiconductor die to fail to perform to specifications or to fail altogether before its normal operational life cycle is reached. Thus, the semiconductor die is subjected to an initial heavy duty cycle which elicits latent silicon defects. Burn-in testing is usually conducted at elevated potentials and for a prolonged period of time, typically 24 hours, at varying and reduced and elevated temperatures, such as −15° C. to 125° C., to accelerate failure mechanisms. Semiconductor dice which survive discrete testing and burn-in are termed "known good die," or "KGD".

As noted above, such testing is generally performed on bare semiconductor dice. However, while desirable for saving the cost of encapsulating bad semiconductor dice, testing bare, unpackaged semiconductor dice requires a significant amount of handling of these rather fragile structures. The temporary package must not only be compatible with test and burn-in procedures, but must also physically secure and electrically access the semiconductor die without damaging the semiconductor die. Similarly, alignment and assembly of a semiconductor die within the temporary package and disassembly after testing must be effected without semiconductor die damage. The small size of the semiconductor die itself and minute pitch (spacing) of the bond pads of the semiconductor die, as well as the fragile nature of the thin bond pads and the thin protective layer covering devices and circuit elements on the active surface of the semiconductor die, make this somewhat complex task extremely delicate. Performing these operations at high speeds with requisite accuracy and repeatability has proven beyond the capabilities of most state of the art equipment. Thus, since the encapsulant of a finished semiconductor die provides mechanical support and protection for the semiconductor die, in some instances, it is preferable to test and burn-in semiconductor dice after encapsulation.

A common finished semiconductor die package design is a flip-chip design. A flip chip semiconductor design comprises a pattern or array of terminations (e.g., bond pads or rerouting trace ends) spaced about an active surface of the semiconductor die for face-down mounting of the semiconductor die to a carrier substrate (such as a printed circuit board, FR4 board, ceramic substrate, or the like). Each termination has a minute solder ball or other conductive connection element disposed thereon for making a connection to a trace end or terminal on the carrier substrate. This arrangement of connection elements is usually referred to as a Ball Grid Array or "BGA". The flip chip is attached to the substrate trace ends or terminals, which are arranged in a mirror-image of the BGA, by aligning the BGA thereover and (if solder balls are used) refluxing the solder balls for simultaneous permanent attachment and electrical communication of the semiconductor die to the carrier substrate conductors.

Such flip chips may be tested and/or burned-in prior to their permanent connection to a carrier substrate by placing each flip chip in a temporary package, such as those discussed above. As shown in FIG. 31, each solder ball 304 attached to a bond pad 302 of a flip chip-configured die 300 is in physical contact with a conductive trace 306 on a contact wall 308 of the temporary package. The conductive traces 306 transmit electrical signals to the die 300 for testing or burn-in. With such a temporary package, each solder ball 304 contacts each conductive trace 306 at only one contact point 310. With only one contact point 310 per ball 304, all of the stresses causal by biasing the die 300 to the contact wall 308 of the temporary package are concentrated on the one contact point 310 on each solder ball 304. These stresses can result in the solder balls 304 fracturing, dislodging from the bond pad 302, or otherwise damaging the flip chip die 300.

Furthermore, such a temporary package configuration is also insensitive to ensuring electrical connection to the temporary package of non-spherical/irregularly shaped solder balls, or different sized balls, in the BGA. FIG. 32 illustrates an undersized solder ball 312 in the arrangement similar to that shown in FIG. 31. Elements common between FIG. 31 and FIG. 32 retain the same designation. The undersized solder ball 312 does not make contact with the conductive trace 306. This can give a false failure indication for the die, when, in reality, it could be "good" when an adequate connection is achieved when the undersized ball 312 is refluxed for permanent attachment to a carrier substrate. At the least, the die in question is initially rejected and must be retested to verify the source of the apparent failure.

Therefore, it would be advantageous to develop improved methods and apparatus for use with flip chip-retaining temporary packages, wherein the temporary packages can compensate for irregular solder ball shape and size, and reduce the risk of damage to the semiconductor device under test.

BRIEF SUMMARY OF THE INVENTION

The present invention relates to a method of forming interconnections for a temporary contact with a semiconductor die, wafer or partial wafer, wherein the interconnections are capable of receiving solder balls for testing and burn-in. The present invention can be used for both wafer level and chip level testing and burn-in, and other probe card technology employing silicon inserts, as well as silicon KGD inserts.

The interconnections are designed to be formed in a recess, preferably a slopedwall (either smooth or "stepped") via. Such an interconnection design compensates for undersized or misshapen solder balls on the die under test to prevent a possible false failure indication for the die under test, and reduces and reorients the stress on each solder ball when physical contact is made to its mating interconnection.

The inventive interconnections are preferably formed by etching the via in a passivation layer which is applied over an active surface of a semiconductor substrate, such as a silicon wafer, a partial wafer the same size or larger than a semiconductor die, or the like. The via may be etched to expose a conductive trace under or within the passivation layer. Alternately, the conductive trace may be formed after the via is formed, wherein the conductive trace is formed on the exposed surface of the passivation layer and extends into the via. A metal layer, preferably of an oxidation-resistant metal such as gold, platinum, palladium, or tungsten, is formed in the via to contact the associated conductive trace and complete the formation of the interconnection.

The interconnection is preferably circular, as viewed from above, to receive the spherical solder ball, which protrudes partially within the interconnect when placed in contact therewith. Preferably, approximately 10% to 50% of the total height of the solder ball, and preferably about 30% of the total height, will reside within the interconnect. With a spherical solder ball in a smooth sloped wall via interconnection, each solder ball will make a circular, or at least arcuate, line of contact with the interconnect surface about a periphery of the solder ball, rather than a single contact point. The circular contact distributes the force on the solder ball when the semiconductor substrate is biased against the insert carrying the interconnection in the temporary package, making damage to the solder ball or underlying bond pad less likely. Further, any oxide layer formed on the exterior surface of the solder ball will be more easily penetrated by the line of contact than through a single contact point effected with prior art interconnections.

With a solder ball received in a stepped-wall interconnection according to the invention, the solder ball may make multiple circular or at least arcuate contacts with the edges of the steps of the stepped interconnection, again facilitating electrical communication and piercing any oxide layer on the solder ball. Such multiple arcuate contacts further distribute the force applied to the solder ball during package assembly and subsequent testing.

In one embodiment of the invention, multiple passivation and trace layers are employed to accommodate small-pitched connection element arrays having as many as a thousand or more inputs and outputs ("I/Os").

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

FIGS. 1–9 illustrate side cross-sectional views of a method of forming a single interconnection of the present invention, although typically hundreds, if not thousands, of such interconnections may be simultaneously fabricated on a single substrate. It should be understood that the figures presented in conjunction with this description are not meant to be illustrations of actual cross-sectional views of any particular portion of an actual semiconductor device, but are merely idealized representations which are employed to more clearly and fully depict the process of the invention than would otherwise be possible. It should also be understood that the figures herein are not meant to be to scale nor otherwise in specific proportion, nor should they be so taken.

Figure 1:
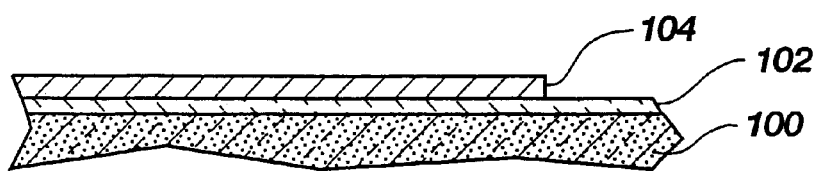
FIGS. 1–9 are side cross-sectional views of a method of forming an interconnection of the present invention.

FIG. 1 illustrates a conductive trace 104, preferably of copper, formed on a dielectric layer 102 (preferably thermally grown $SiO_2$) which resides on a semiconductor substrate, such as a silicon wafer 100. A bulk silicon structure, such as a silicon-on-sapphire (SOS) structure, a silicon-on-glass (SOG) structure, or other silicon-on-insulator (SOI) structure, may also be employed. By employing silicon at least as the exposed substrate layer supporting interconnections according to the invention, the coefficient of thermal expansion (CTE) is matched with that of the silicon semiconductor die, partial wafer or wafer under test, a significant feature given the wide temperature swings experienced by the die and substrate bearing the inventive interconnections during burn-in. Thus, thermally-induced stresses on the solder balls of a flip-chip configured die, partial wafer or wafer are minimized.

Figure 2:
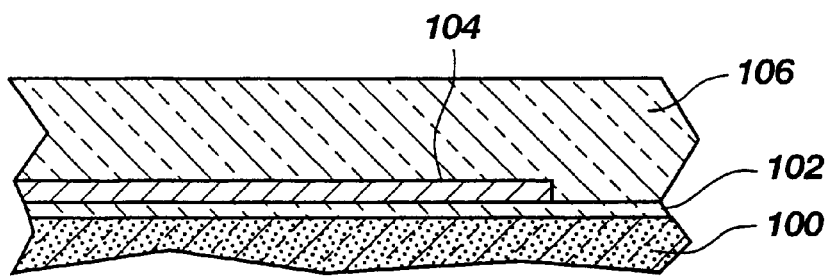
Figure 3:
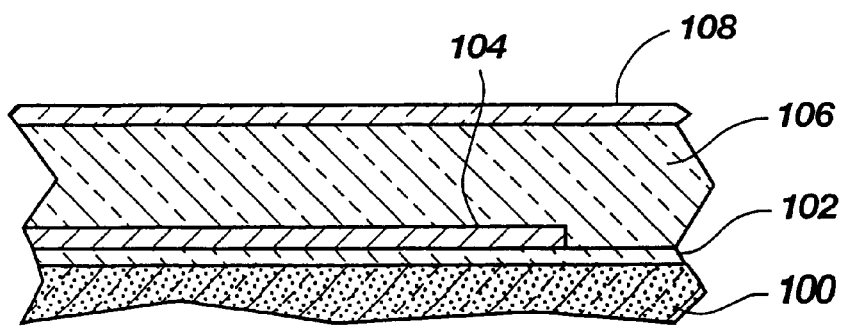
Figure 4:
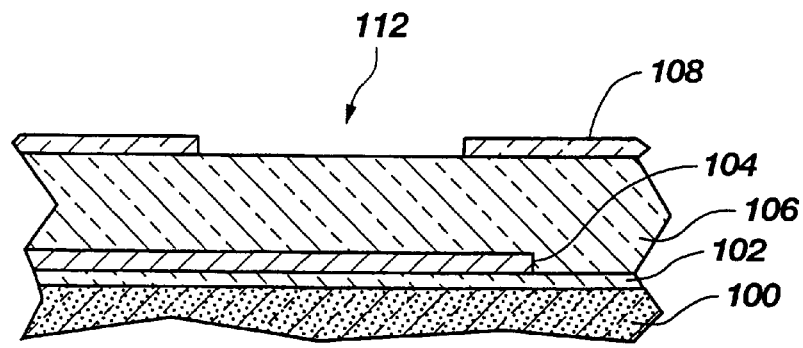
Figure 5:
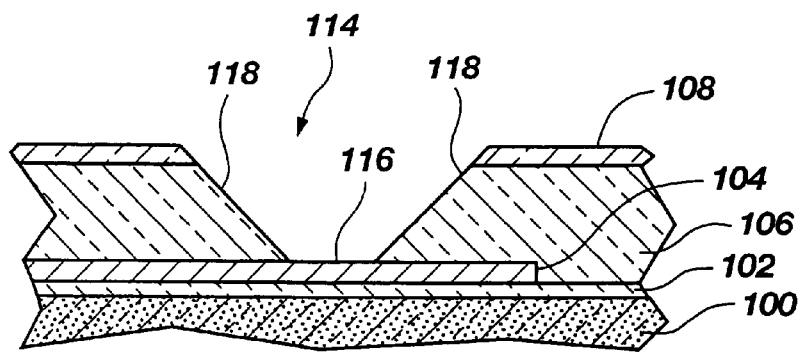
Figure 6:
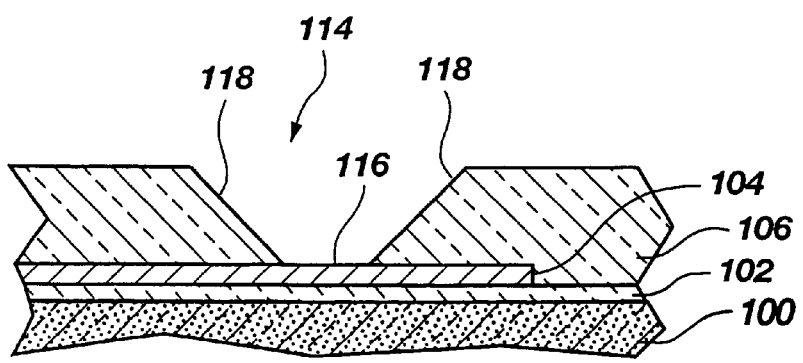

The conductive trace 104 contacts external circuitry of the package base (not shown) through TAB tape, wire bonds, or other conductive structures, which transmit appropriate electrical signals for burn-in, testing, or the like. A passivation film 106 is formed over the dielectric layer 102, as well as the conductive trace 104, as shown in FIG. 2. The passivation film 106 is preferably a polyimide film or other thick resin with a thickness of about 0.8 to– mil, or 20–25 microns, if a nominal 3 mil, or 75 micron, solder ball is to be contacted, as will be explained below. If the ball size is enlarged, for example, to about 13 mil or 325 microns, then the thickness of this film should be changed accordingly to about 4 mil, or 100 microns. While other passivation materials such as silicon nitride, borophosphosilicate glass (BPSG), phosphosilicate glass (PSG) or borosilicate glass (BSG) may be employed, polyimide is preferred as it exhibits a lower ethan the other materials, resulting in reduced capacitance in the structure including the interconnection and associated traces, and faster signal transmission along the copper insert traces. A layer of etchant-resistive photoresist film 108 is then applied over the passivation film 106, as shown in FIG. 3. The photoresist film 108 is then masked, exposed, and stripped to form a desired opening 112, preferably circular, in the photoresist film 108, as shown in FIG. 4. The passivation film 106 is then etched through the opening 112 in photoresist film 108 to form a via 114 with either sloped edges or walls 118 (preferably by facet etching) or straight (vertical) walls if desired, and which exposes a face surface 116 of the conductive trace 104, as shown in FIG. 5. The photoresist film 108 is then stripped, as shown in FIG. 6.

Figure 7:
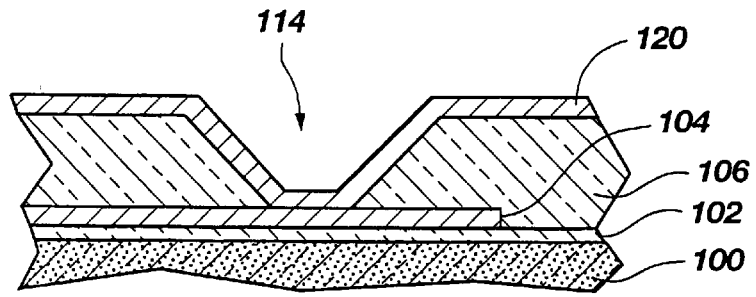

As shown in FIG. 7, a metal layer 120, preferably a metal such as gold, platinum, palladium, tungsten, or the like, to prevent oxidation of the exposed interconnection surface, is applied over the passivation film 106, as well as in the via 114 by chemical vapor deposition (CVD), plasma-enhanced chemical vapor deposition (PECVD), physical vapor deposition (PVD) (sputtering or evaporation), or the like. The metal layer 120 may also be comprised of superimposed metal layers, such as chromium, copper, chromium-copper alloy, titanium, or the like, to effect a better metallurgical connection to conductive trace 104, with a noble metal outer layer for contact with the solder ball.

Figure 8:
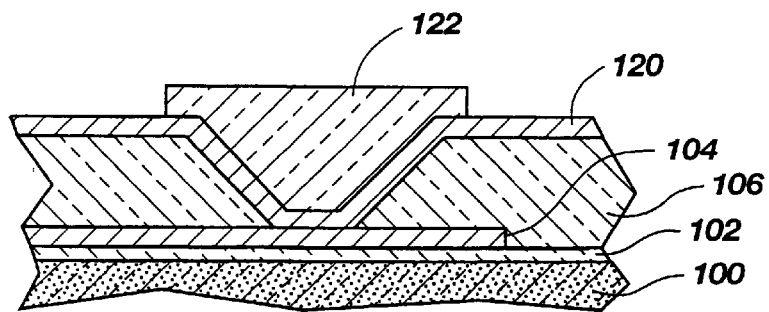
Figure 9:
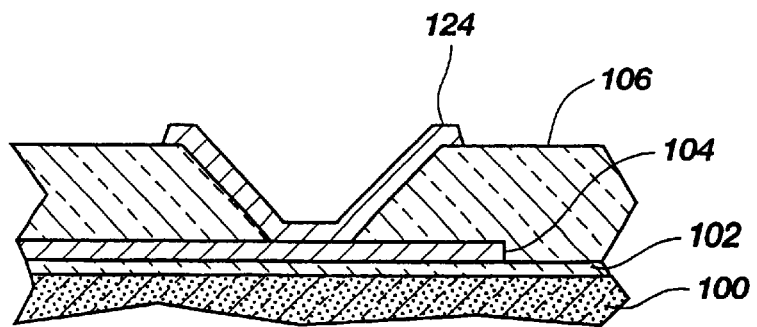
Figure 10:
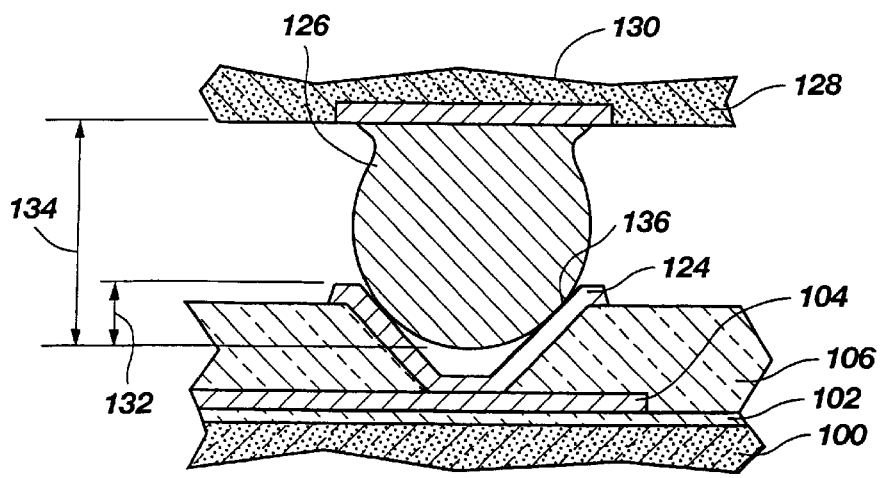
FIG. 10 illustrates a solder ball of a die on a substrate, such as a silicon test package insert, residing in one embodiment of an interconnection of the present invention.
Figure 11:
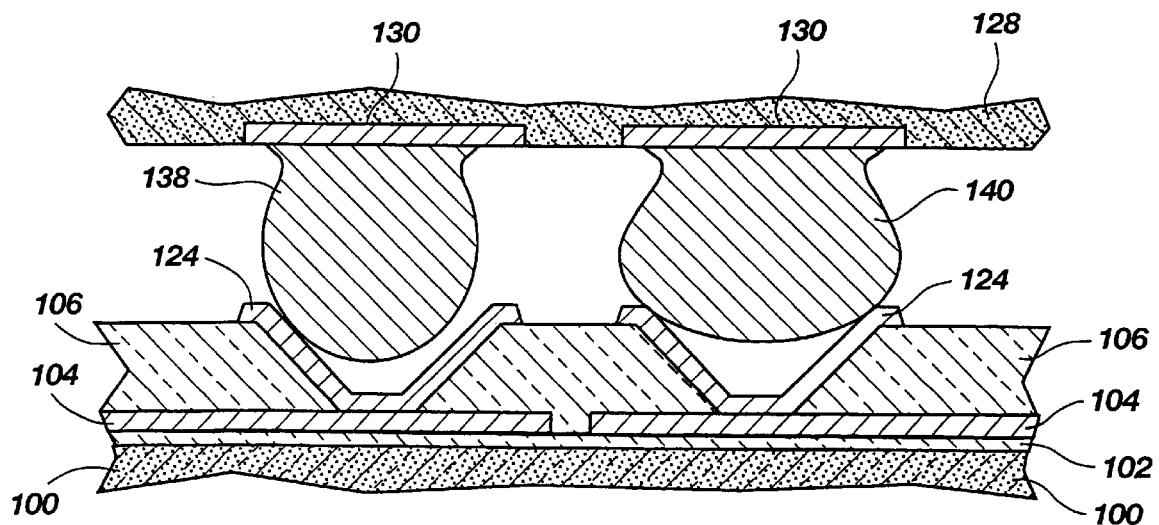
FIG. 11 illustrates an undersized solder ball and a misshapen solder ball of a die on a substrate, such as a silicon test package insert, residing in interconnections of the present invention.

A layer of etchant-resistive photoresist film is applied over metal layer 120 and is then masked, exposed, and stripped to form an etchant-resistive block 122 over the via 114, as shown in FIG. 8. The metal layer 120 surrounding the via 114 is then etched down to the surface of passivation film 106 and the etchant-resistive block 122 is stripped to form a discrete interconnection 124, as shown in FIG. 9. The discrete interconnection 124, for example, receives a solder ball 126 (typically a 95%:5% or 63%:37% lead/tin solder ball) which is attached to a bond pad 130 of a semiconductor element 128, such as a die, partial wafer or wafer, as shown in FIG. 10. The discrete interconnection 124 is sized in combination with the slope of the walls of the sloped-wall via as shown and the depth or thickness of the passivation film 106 through which via 114 is etched to receive therein approximately 10% to 50%, and preferably about 30%, of the overall height of the solder ball 126. In other words, the height 132 within the discrete interconnection 124 is approximately 10% to 50%, and preferably about 30%, of the overall height 134 of the solder ball 126. The solder ball 126 preferably makes contact with the discrete interconnection 124 at a contact line 136 at least partially circling the solder ball 126. The shape of the discrete interconnection 124 allows undersized solder balls 138 and misshapen solder balls 140, which are attached to bond pads 130 of semiconductor element 128, to still make adequate electrical contact with the discrete interconnection 124, as shown in FIG. 11.

Moreover, thermally-induced fatigue, which can result in solder ball breakage, is lessened due to the enhanced contact area.

Figure 12:
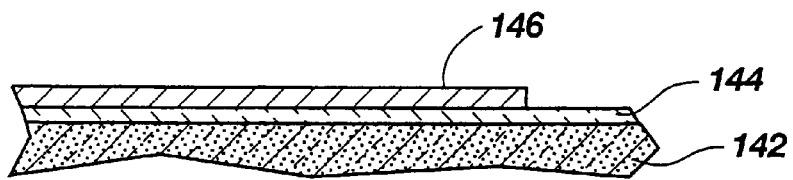
FIGS. 12–25 are side cross-sectional views of another method of forming an interconnection of the present invention.
Figure 13:
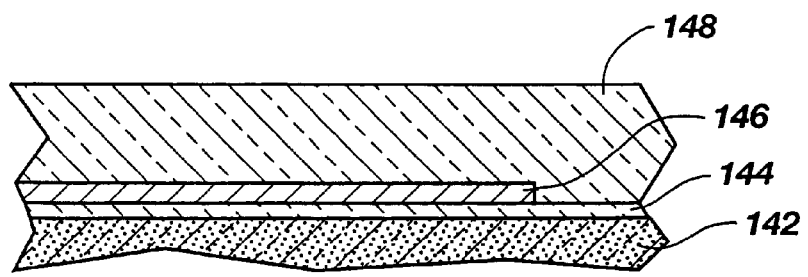
Figure 14:
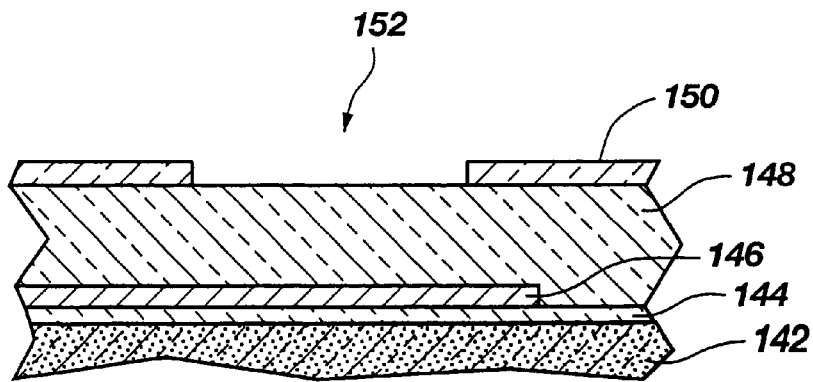
Figure 15:
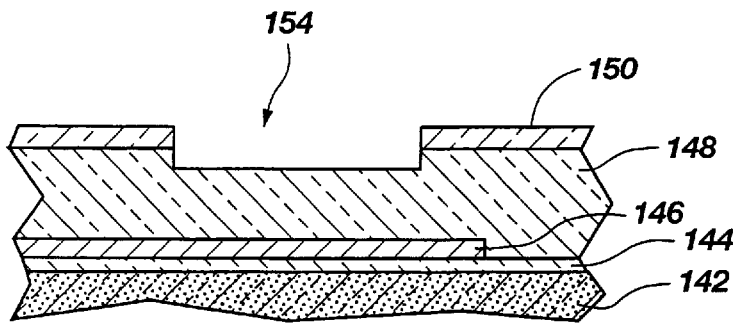
Figure 16:
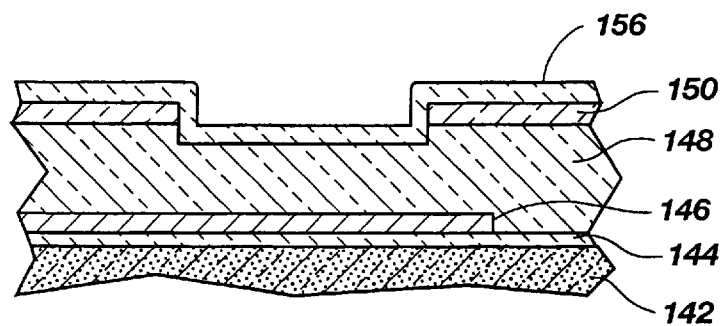
Figure 17:
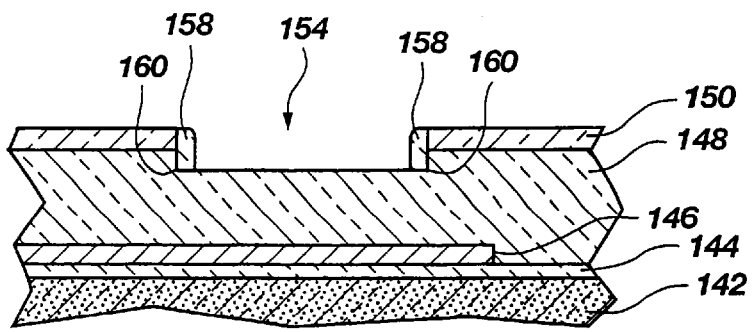

FIGS. 12–25 illustrate an alternative method of forming an interconnection of the present invention. FIG. 12 illustrates a conductive trace 146 (again, preferably of copper) formed on a dielectric layer 144 (again, preferably of a thermally grown oxide) which resides on a semiconductor substrate 142. The conductive trace 146 contacts external circuitry (not shown) which transmits appropriate electrical signals for burn-in, testing, or the like. A passivation film 148, preferably a polyimide film, is formed over the dielectric layer 144, as well as the conductive trace 146, as shown in FIG. 13. A layer of etchantresistive photoresist film 150 is then applied over the passivation film 148 and is then masked, exposed, and stripped to form a desired opening 152, preferably circular, in the photoresist film 150, as shown in FIG. 14. The passivation film 148 is then etched through the opening in photoresist film 150 to a predetermined depth to form a first via portion 154 into the passivation film 148, as shown in FIG. 15. A first layer of silicon dioxide 156 is deposited over the photoresist film 150 and an exposed portion of the passivation film 148, as shown in FIG. 16. The first silicon dioxide layer 156 is then etched, preferably spacer etched, to form a first lip 158 of silicon dioxide in the corners 160 of the first via portion 154 and to expose a portion of the passivation film 148 in the first via portion 154, as shown in FIG. 17.

Figure 18:
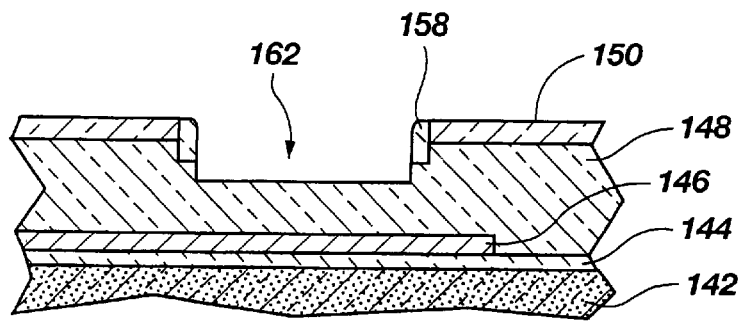
Figure 19:
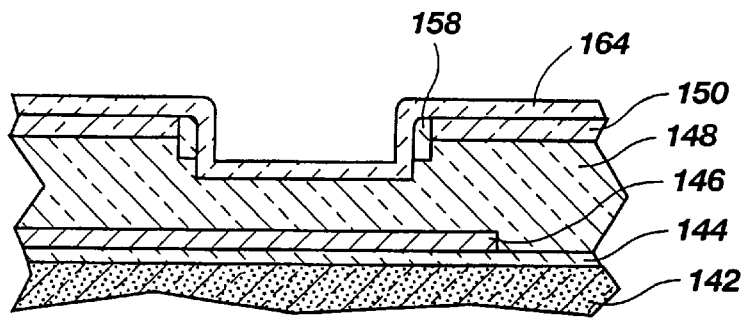
Figure 20:
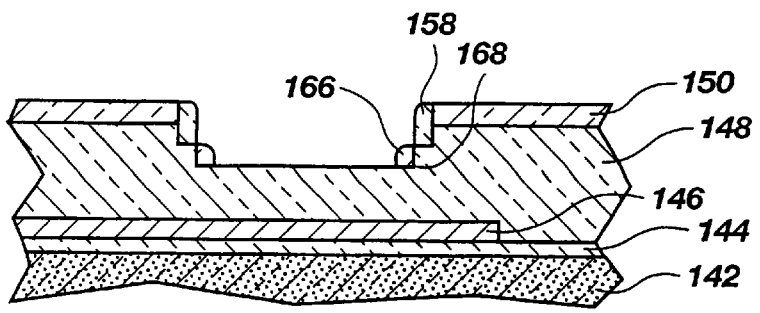
Figure 21:
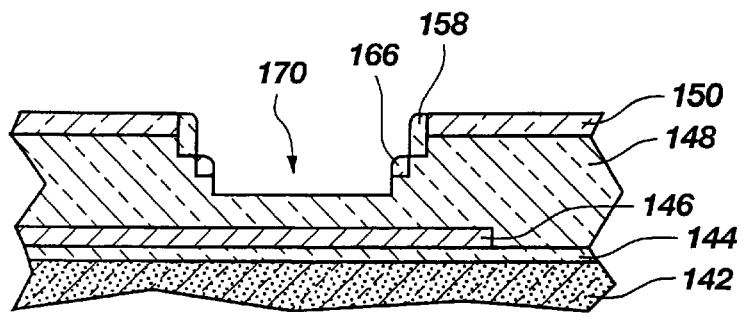

As shown in FIG. 18, the passivation film 148 is again etched to a predetermined depth to form a second via portion 162. A second layer of silicon dioxide 164 is deposited over the photoresist film 150, the first lip 158, and an exposed portion of the passivation film 148, as shown in FIG. 19. The second silicon dioxide layer 164 is then etched to form a second lip 166 of silicon dioxide in the corners 168 of the second via portion 162 and to expose a portion of the passivation film 148 in the second via portion 162, as shown in FIG. 20. The passivation film 148 is again etched to a predetermined depth to form a third via portion 170, as shown in FIG. 21.

Figure 22:
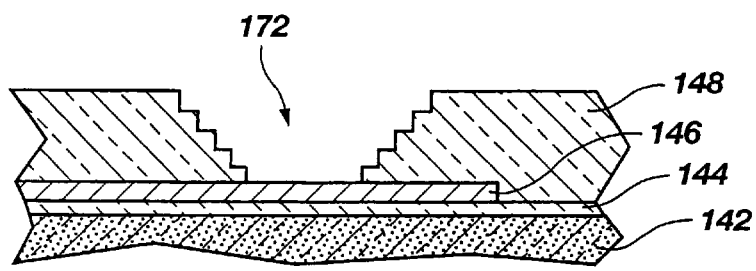

This process is repeated until the step-by-step etching of the passivation film 148 results in the exposure of the conductive trace 146, wherein the photoresist film 150 and the lips (i.e., 158, 166, and others formed thereafter) are removed, resulting in the stepped via 172 shown in FIG. 22.

Figure 23:
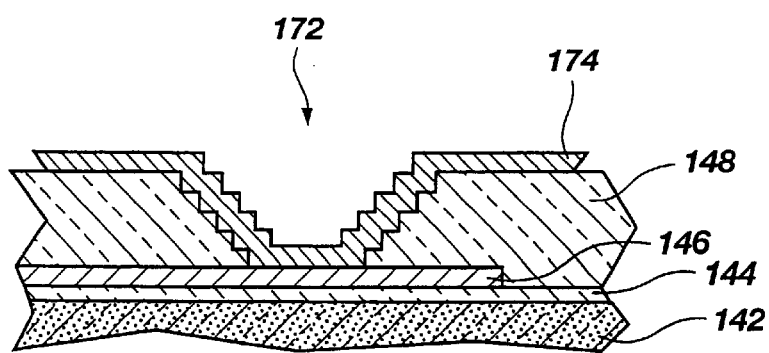
Figure 24:
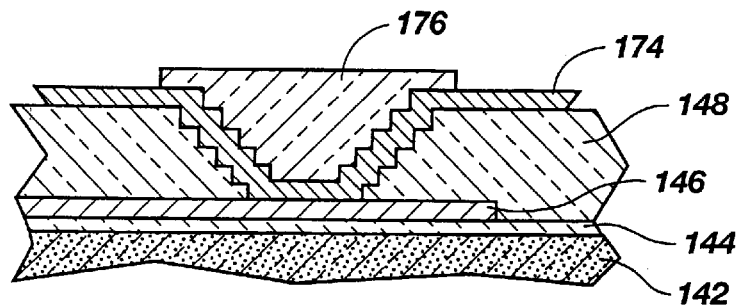
Figure 25:
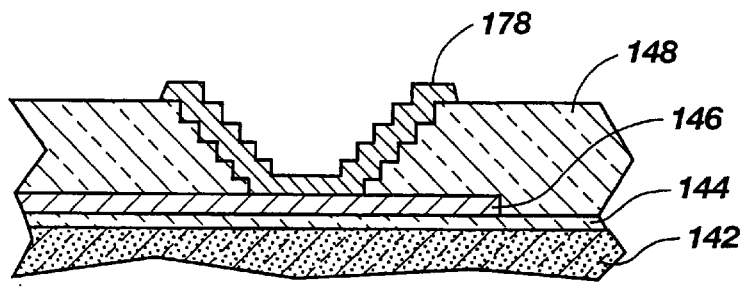
Figure 26:
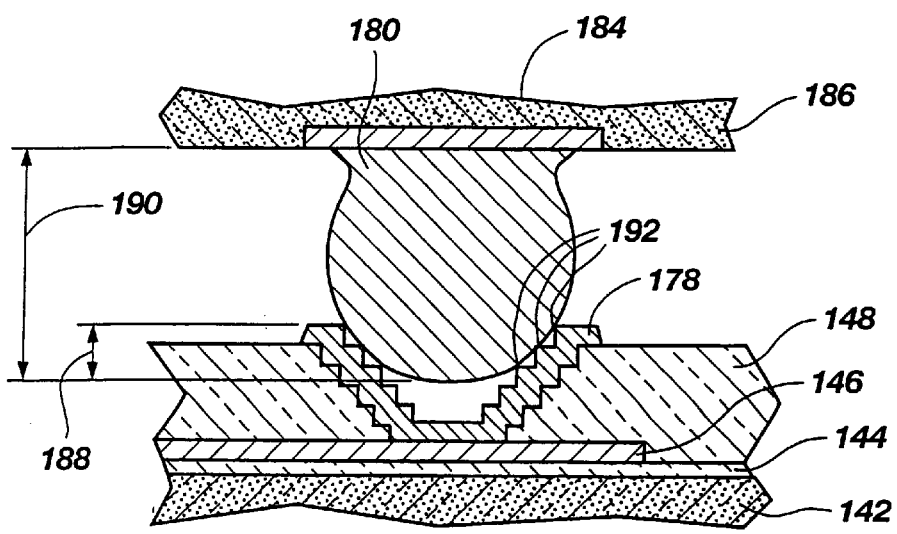
FIG. 26 illustrates a solder ball of a die on a substrate, such as a silicon test package insert, residing in another embodiment of an interconnection of the present invention.

As shown in FIG. 23, a metal layer 174 is applied over the passivation film 148, as well as over and into the stepped via 172. A layer of etchant-resistive photoresist film is applied over metal layer 174 and is then masked, exposed, and stripped to form an etchant-resistive block 176 over the stepped via 172, as shown in FIG. 24. The metal layer 174 surrounding the stepped via 172 is then etched and the etchant-resistive block 176 is stripped to form a discrete interconnection 178, as shown in FIG. 25. The discrete interconnection 178, for example, receives a solder ball 180, which is attached to a bond pad 184 of a semiconductor element 186, such as a die, partial wafer or wafer, as shown in FIG. 26. The discrete interconnection 178 is designed to receive approximately 10% to 50%, and preferably about 30%, of the overall height of the solder ball 180. In other words, the solder ball height segment 188, protruding within the discrete interconnection 178, is approximately 10% to 50%, and preferably about 30%, of the overall height 190 of the solder ball 180.

Figure 27:
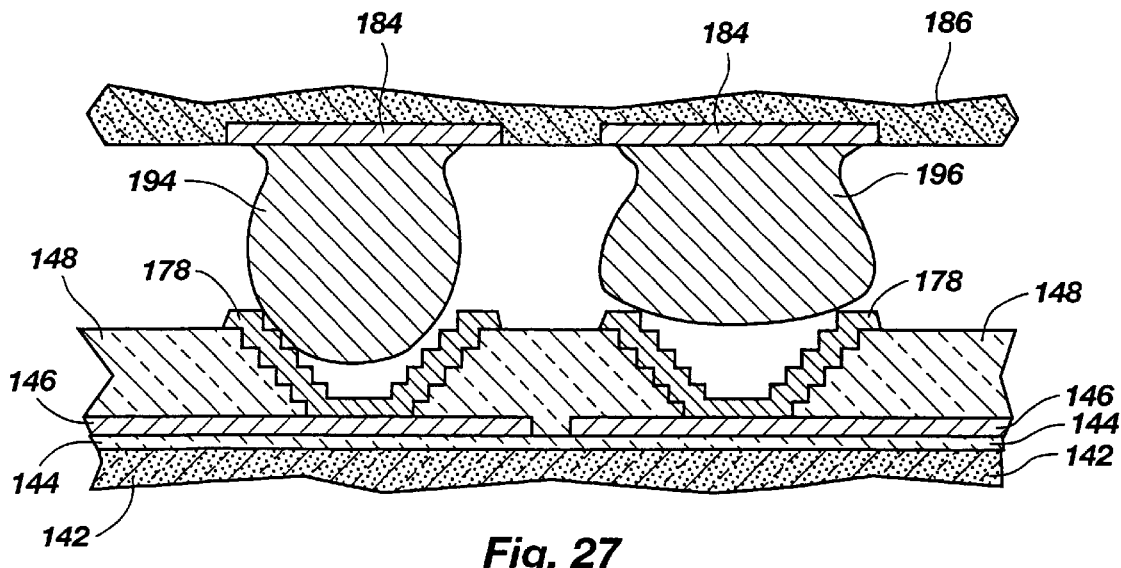
FIG. 27 illustrates a small solder ball and a misshapen solder ball of a die on a substrate, such as a silicon test package insert, residing in interconnections of the present invention.

The discrete interconnection 178 has a staggered surface which may contact the solder ball 180 at several contact lines 192 circling or partially circling the solder ball 180. The shape of the discrete interconnection 178 allows small solder balls 194 and misshapen solder balls 196, which are attached to bond pads 184 of semiconductor element 186, to still make extensive electrical contact with the discrete interconnection 178, as shown in FIG. 27.

Figure 28:
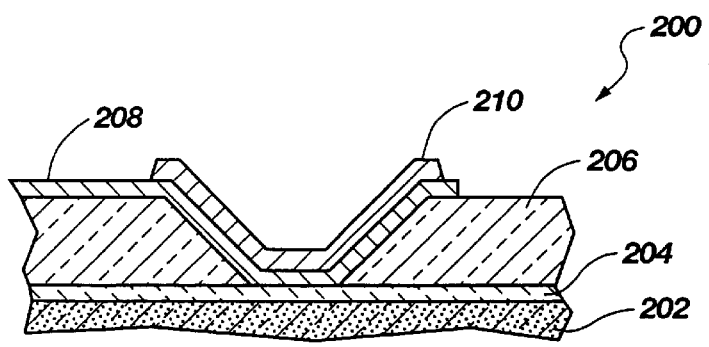
FIG. 28 is a side cross-sectional view of an alternate conductive trace configuration for the interconnection of the present invention.

It is, of course, understood that the conductive traces such as 104, 146 need not necessarily be buried under the passivation film 106, 148. FIG. 28 shows an alternate conductive trace configuration 200. The alternate conductive trace configuration 200 comprises a substrate 202 with a passivation film 206 formed over a dielectric layer 204. A via is formed in the passivation film 206 as discussed above. The conductive trace 208 is then formed over the passivation film 206 and into the via. A discrete interconnection 210, such as a layer of gold or other oxidation-resistant metal, is formed on the portion of conductive trace 208 lying within the via.

Figure 29:
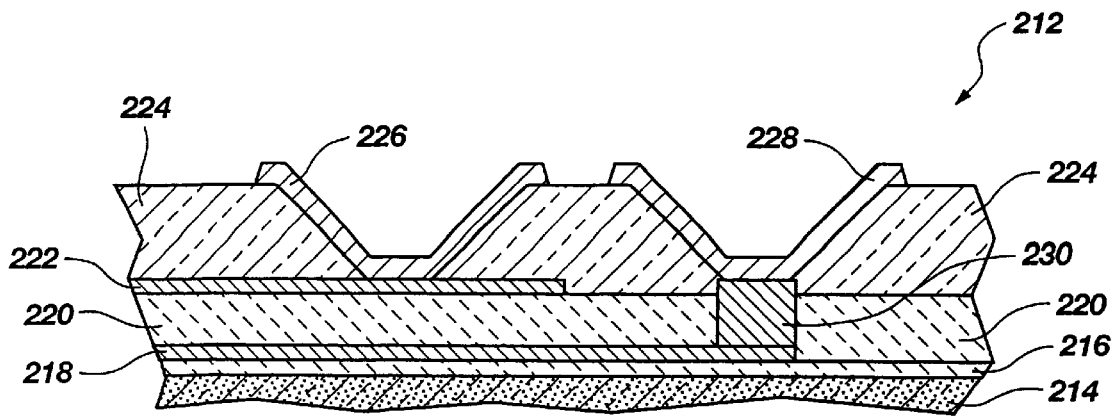
FIG. 29 is a side cross-sectional view of a multi-layer trace configuration for the interconnections of the present invention.

The present invention may also be applied to multi-layer conductive trace configurations, as shown in FIG. 29. The multi-layer conductive trace configuration 212 comprises a substrate 214 with a dielectric layer 216 thereof A lower conductive trace 218 is formed over the dielectric layer 216. A lower passivation layer 220 is formed over the lower conductive trace 218 and the dielectric layer 216. An upper conductive trace 222 is formed on the lower passivation layer 220 and an upper passivation layer 224 is formed over the upper conductive trace 222 and the lower conductive trace 218. Discrete interconnections 226 and 228 are formed in a manner discussed above to contact the upper conductive trace 222 and the lower conductive trace 218, respectively. The discrete interconnection 228 contacts the lower conductive trace 218 through a conductive column 230 extending through the lower passivation layer 220. It will be understood that such a structure may include three or more trace layers in lieu of the two shown, so as to accommodate a large number of interconnections such as 226 and 228 at a small pitch so as to accommodate one of the aforementioned thousand-plus I/O semiconductor dice.

Figure 30:
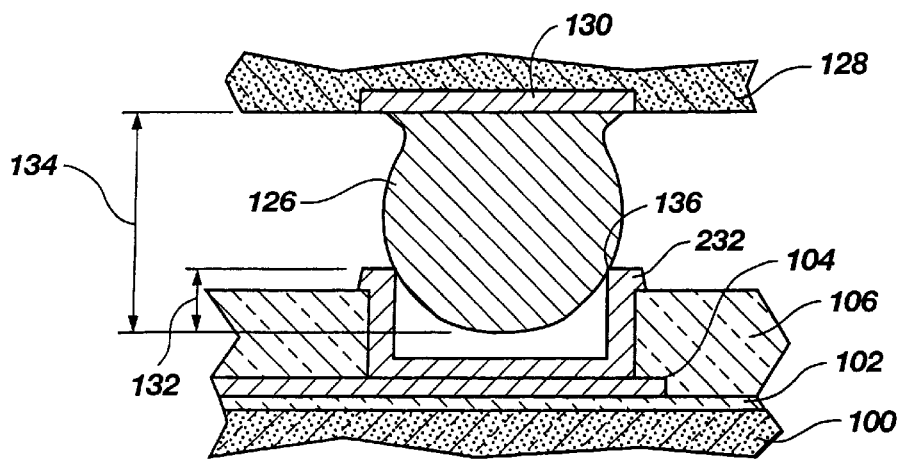
FIG. 30 illustrates a solder ball on a substrate residing in yet another embodiment of an interconnection of the present invention.
Figure 31:
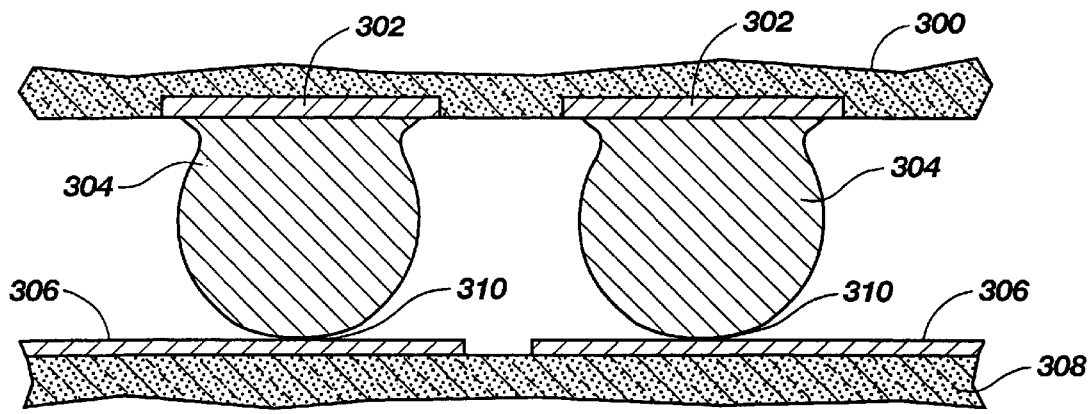
FIG. 31 is a side cross-sectional view of a prior art temporary package with solder balls of a die in contact therewith.
Figure 32:
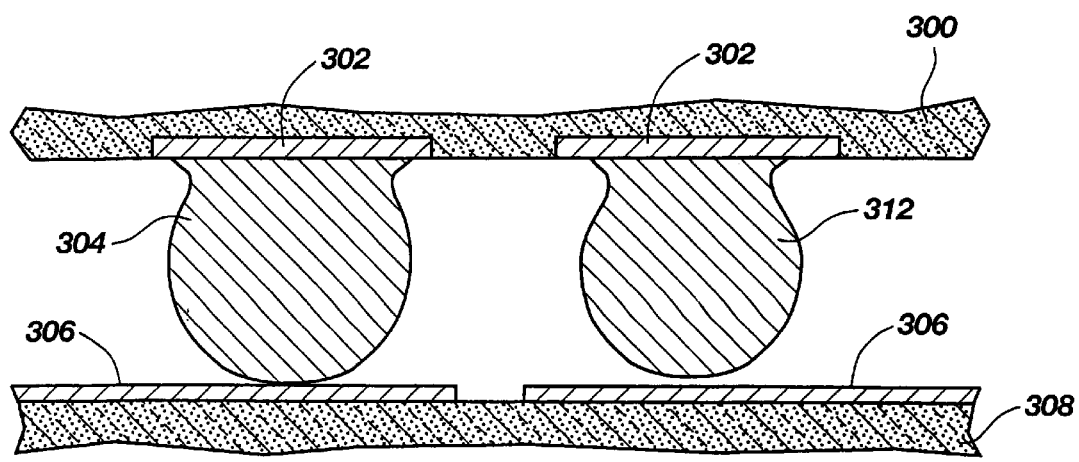
FIG. 32 is a side cross-sectional view of a prior art temporary package with two solder balls of a die, one undersized, disposed thereagainst.

FIG. 30 illustrates yet another embodiment of the interconnect of the present invention. Elements common to FIG. 10 and FIG. 30 retain the same numeric designation. The discrete interconnect 232 is formed by etching the substantially vertical walls for the via rather than sloped walls, but is otherwise formed in a similar method to that described and illustrated in FIGS. 1–9. The discrete interconnection 232 receives a solder ball 126 which is attached to a bond pad 130 of a semiconductor element 128, such as a die or wafer, as shown in FIG. 30. The discrete interconnection 232 is also sized in diameter to receive approximately 10% to 50%, and preferably about 30%, of the overall height of the solder ball 126. In other words, the height 132 received within the discrete interconnection 232 is approximately 10% to 50%, and preferably about 30%, of the overall height 134 of the solder ball 126.

Although the present disclosure focuses on testing flip chip-configured singulated dice, it is, of course, understood that this technology can be applied on a wafer or partial-wafer scale.

Having thus described in detail certain preferred embodiments of the present invention, it is to be understood that the invention defined by the appended claims is not to be limited by particular details set forth in the above description, as many additions, deletions and modifications thereto are possible without departing from the scope thereof

What is claimed is:

1. A method of fabricating an interconnection for receiving a substantially spherical interconnection element of a semiconductor device comprising:

provided a semiconductor substrate;

forming a dielectric layer on said semiconductor substrate;

forming at least one conductive trace over said dielectric layer;

forming a passivation layer over said least one conductive trace and said dielectric layer;

forming a layer of etch resistive photoresist film over said passivation layer, wherein said layer of etch resistive photoresist film includes at least one opening above said at least one conductive trace through which said passivation layer is exposed;

etching said passivation layer through said at least one opening to a predetermined depth to form a via portion extending partially through said passivation layer;

depositing a layer of silicon dioxide over said etch resistive photoresist film and in said via portion;

etching said layer of silicon dioxide down to said passivation layer and a bottom of said via portion to form a lip of silicon dioxide within a peripheral edge of said via portion;

repeating the steps of etching said passivation layer, depositing said silicon dioxide layer, and etching said layer of silicon dioxide to form additional via portions each having a lip of silicon dioxide within a peripheral edge thereof, until a via is completed to expose a portion of said at least one conductive trace;

removing said etch resistive photoresist film and said lips of silicon dioxide;

forming a metal layer over said passivation layer and into said via in contact with said at least one conductive trace; and removing said metal layer surrounding said via to define an interconnection.

2. The method of claim 1, wherein said interconnection is formed of a size and shape to receive approximately 10% to 50% of an overall height of said substantially spherical interconnection element.

3. The method of claim 2, wherein said interconnection is formed of a size and shape to receive approximately 30% of an overall height of said substantially spherical interconnection element.

4. The method of claim 1, wherein said etching of said layer of silicon dioxide comprises spacer etching.

5. The method of claim 1, wherein said etching of said passivation layer forms a via having stepped walls.

6. The method of claim 1, wherein said at least one conductive trace comprises copper.

7. The method of claim 1, wherein said passivation layer comprises polyimide.

8. The method of claim 1, wherein said metal layer comprises a metal from the group comprising gold, platinum, palladium, and tungsten.

* * * * *

UNITED STATES PATENT AND TRADEMARK OFFICE
CERTIFICATE OF CORRECTION

PATENT NO. : 6,214,716 B1  Page 1 of 2
DATED : April 10, 2001
INVENTOR(S) : Salman Akram It is certified that error appears in the above-identified patent and that said Letters Patent is hereby corrected as shown below:

Title page,
Item [54], Title, change "FARICATION" to -- FABRICATING --.

Drawings,
In FIG. 28, insert reference numeral -- 207 -- with its appropriate lead line (as shown below page).

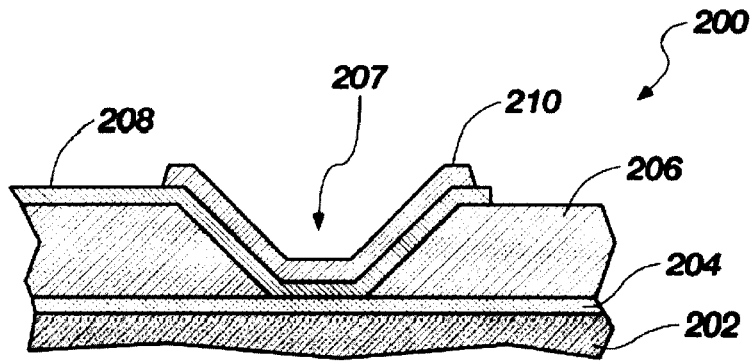

Fig. 28

Column 2,
Lines 6, 8, 12 and 17, change "which" to -- that --.

Column 3,
Line 12, insert "solder" before "ball" and change "causal" to -- caused --.
Line 17, change "flip chip" to -- flip-chip-configured --.
Lines 22 and 25, change "undersized" to -- under-sized --.
Line 50, change "slopedwall" to -- sloped-wall --.

Column 4,
Line 37, change "("I/Os")" to -- (I/Os) --.
Line 53, change "undersized" to -- under-sized --.

Column 5,
Line 32, change "which" to -- that --.
Line 39, after "$SiO_2$)" insert a comma.
Line 60, change "to–" to -- to 1 -- and change "20–25" to -- 20 to 25 --.

UNITED STATES PATENT AND TRADEMARK OFFICE
CERTIFICATE OF CORRECTION

PATENT NO.    : 6,214,716 B1
DATED         : April 10, 2001
INVENTOR(S)   : Salman Akram It is certified that error appears in the above-identified patent and that said Letters Patent is hereby corrected as shown below:

Column 6,
Line 8, change "εthan" to -- ε than --.
Line 9, change "structure" to -- structure, --.
Line 44, change "ball)" to -- ball), --.
Line 48, after "via" insert -- 114 --.
Line 58, change "undersized" to -- under-sized --.

Column 7,
Line 8, change "oxide)" to -- oxide), --.
Line 10, change "which" to -- that --.
Line 14, change "etchantresistant" to -- etchant-resistant --.
Line 19, after "opening" insert -- 152 --.
Line 24, after "first" insert -- layer of -- and after "dioxide" delete "layer".
Line 34, after "second" insert -- layer of -- and after "dioxide" delete "layer".

Column 8,
Line 4, change "surface" to -- surface, --.
Line 18, after "via" insert -- 207 --.
Lines 20 and 23, after "via" and before the period insert -- 207 --.
Line 27, insert a period after "thereof".

Column 9,
Line 6, insert a period after "thereof".

Signed and Sealed this

Twenty-seventh Day of September, 2005

JON W. DUDAS
*Director of the United States Patent and Trademark Office*